United States Patent
Koestler et al.

(10) Patent No.: US 11,316,058 B2
(45) Date of Patent: Apr. 26, 2022

(54) STACKED MULTI-JUNCTION SOLAR CELL WITH A METALLIZATION COMPRISING A MULTILAYER SYSTEM

(71) Applicant: AZUR SPACE Solar Power GmbH, Heilbronn (DE)

(72) Inventors: Wolfgang Koestler, Heilbronn (DE); Benjamin Hagedorn, Ellhofen (DE)

(73) Assignee: AZUR SPACE Solar Power GmbH, Heilbronn (DE)

(*) Notice: Subject to any disclaimer, the term of this patent is extended or adjusted under 35 U.S.C. 154(b) by 0 days.

(21) Appl. No.: 17/007,597

(22) Filed: Aug. 31, 2020

(65) Prior Publication Data
US 2021/0066517 A1    Mar. 4, 2021

(30) Foreign Application Priority Data
Aug. 29, 2019    (DE) .................... 10 2019 006 099.7

(51) Int. Cl.
  *H01L 31/00*     (2006.01)
  *H01L 31/0224*   (2006.01)
  (Continued)

(52) U.S. Cl.
  CPC .. *H01L 31/02245* (2013.01); *H01L 31/02167* (2013.01); *H01L 31/0336* (2013.01); *H01L 31/0687* (2013.01); *H01L 31/078* (2013.01)

(58) Field of Classification Search
  CPC ......... H01L 31/02245; H01L 31/02167; Y02E 10/544
  See application file for complete search history.

(56) References Cited

U.S. PATENT DOCUMENTS 9,680,035 B1    6/2017  Chary et al.
2006/0231130 A1*  10/2006  Sharps ............ H01L 31/022433
                                                      136/243
(Continued)

FOREIGN PATENT DOCUMENTS

CN    106298513 A    1/2017
EP      1715529 A2   10/2006
(Continued)

OTHER PUBLICATIONS

Huo ("Comparison of Ti/Pd/Ag, Pd/Ti/Pd/Ag and Pd/Ge/Ti/Pd/Ag contacts to n-type GaAs for electronic devices handling high current densities") Semicond. Sci. Technol. 32 (2017) 045006 (9pp) (Year: 2017).*

(Continued)

*Primary Examiner* — Angelo Trivisonno
(74) *Attorney, Agent, or Firm* — Muncy, Geissler, Olds & Lowe, P.C.

(57) ABSTRACT

A stacked multi-junction solar cell with a metallization comprising a multilayer system, wherein the multi-junction solar cell has a germanium substrate forming a bottom side of the multi-junction solar cell, a germanium subcell, and at least two III-V subcells, the multilayer system of the metallization has a first layer, comprising gold and germanium, a second layer comprising titanium, a third layer, comprising palladium or nickel or platinum, with a layer thickness, and at least one metallic fourth layer, and the multilayer system of the metallization covers at least one first and second surface section and is integrally connected to the first and second surface section, wherein the first surface section is formed by the dielectric insulation layer and the second surface section is formed by the germanium substrate or by a III-V layer.

12 Claims, 1 Drawing Sheet

(51) Int. Cl.
*H01L 31/0216* (2014.01)
*H01L 31/0336* (2006.01)
*H01L 31/0687* (2012.01)
*H01L 31/078* (2012.01)

(56) References Cited

U.S. PATENT DOCUMENTS

| | | | | |
|---|---|---|---|---|
| 2010/0218819 | A1* | 9/2010 | Farmer | H01L 31/0693 |
| | | | | 136/256 |
| 2010/0289103 | A1* | 11/2010 | Yamamoto | H01L 31/105 |
| | | | | 257/458 |
| 2013/0125976 | A1* | 5/2013 | Romijn | H01L 31/02021 |
| | | | | 136/256 |
| 2013/0133737 | A1* | 5/2013 | Umeda | H01L 31/022458 |
| | | | | 136/256 |
| 2014/0196779 | A1* | 7/2014 | Fidaner | H01L 31/02245 |
| | | | | 136/255 |

FOREIGN PATENT DOCUMENTS

| | | |
|---|---|---|
| ES | 2665809 A1 | 4/2018 |
| WO | WO89/05521 | 6/1989 |

OTHER PUBLICATIONS

Horng ("Reliability Analysis of III-V Solar Cells Grown on Recycled GaAs Substrates and an Electroplated Nickel Substrate") International Journal of Photoenergy vol. 2013, Article ID 108696, 9 pages http://dx.doi.org/10.1155/2013/108696 (Year: 2013).*
C. Chu et al "Contact Processing Methods for Production III-V Solar Cells" Proceedings of the Photovoltaic Specialists Conference. Louisville, May 10-14, 1993, (Proceedings of the Photovoltaic Specialists Conference), New York, IEEE, US, Bd. Conf. 23, May 10, 1993, pp. 728-734, XP010113162, ISBN: 978-0-7803-1220-3.
H. Yoo et al: "Development of Coplanar back Contact for Large Area, Thin, GaAs/Ge Solar Cells" Proceedings of the Photovoltaic Specialists Conference. Las Vegas, Oct. 7-11, 1991 (Proceedings fo the Photovoltaic Specialists Conference), New York, IEEE, US, Bd. Conf. 22, Oct. 7, 1991, pp. 1463-1468, XP010039150, ISBN: 978-0-87942-636-1.
J. Fernández et al: "Back-surface Optimization of Germanium TPV Cells", Worl dConference on Thermophotovoltaic Generation of Electricity, Bd. 890, Nr. 1, Sep. 25, 2006, pp. 190-197, XP002457494.
Mathieu de Lafontaine et al: "III-V/Ge Multijunction Solar Cell with Through Cell Via Contacts Fabrication", $65^{th}$ International AVS Symposium & Topical Conferences, Oct. 23, 2018, pp. 1-2, XP055752225, Long Beach, CA, USA.
E. Oliva et al. "III-V Multi-Junction Metal-Wrap-Through (MWT) Concentrator Solar Cells", Proceedings, $32^{nd}$ European PV Solar Energy Conference and Exhibition, Munich, 2016, pp. 1367-1371.
Florian Clement; "Die Metal Wrap Through Solarzelle—Entwicklung und Charakterisierung", Dissertation, pp. 1-251 with English Abstract (Feb. 2009).

* cited by examiner

STACKED MULTI-JUNCTION SOLAR CELL WITH A METALLIZATION COMPRISING A MULTILAYER SYSTEM

This nonprovisional application claims priority under 35 U.S.C. § 119(a) to German Patent Application No. 10 2019 006 099.7, which was filed in Germany on Aug. 29, 2019, and which is herein incorporated by reference.

BACKGROUND OF THE INVENTION

Field of the Invention

The present invention relates to stacked multi-junction solar cells with a metallization comprising a multilayer system.

Description of the Background Art

Different methods for metallizing semiconductor wafers are known. The desired metal structure is produced, for example, with the aid of a resist mask from a positive resist or from a negative resist, wherein the metal is applied in a planar manner, e.g., by means of physical vapor deposition. Alternatively, printing methods are used, e.g., screen printing or dispensing heads, which apply only the desired metal structure directly.

In order to reduce the shadowing of the front side of a solar cell, it is possible to contact the front side from the back side by means of a through-contact hole. Such solar cells are also known as metal wrap through (MWT) solar cells.

In addition to different production methods for the through-contact holes, different metallization methods are also known in order to achieve, in particular, reliable metallization in the area of the through-contact hole.

A production method for a MWT single solar cell made of multicrystalline silicon is known from "The Metal Wrap Through Solar Cell—Development and Characterization," F. Clement, dissertation, February 2009, wherein the through-contact holes are produced using a UV laser or an IR laser in an mc-Si substrate layer. Only then is an emitter layer produced by means of phosphorus diffusion along the top side, the side surfaces of the through-contact hole, and the bottom side of the solar cell.

The through-contact hole is filled with a conductive via paste, e.g., a silver paste, by means of screen printing.

An inverted grown GaInP/AlGaAs solar cell structure with through-contact holes is known from "III-V multi-junction metal-wrap-through (MWT) concentrator solar cells," E. Oliva et al., Proceedings, 32$^{nd}$ European PV Solar Energy Conference and Exhibition, Munich, 2016, pp. 1367-1371, wherein the solar cell structure with the p-n junctions is grown epitaxially and the through-contact holes are only then produced by means of dry etching. A side surface of the through-hole is then coated with an insulation layer and the through-hole is then filled with galvanized copper.

A solar cell stack made up of multiple III-V subcells on a GaAs substrate with a back-contacted front side is known from U.S. Pat. No. 9,680,035 B1, wherein a hole extending from the top side of the solar cell through the subcells into a substrate layer that has not yet been thinned is produced by means of a wet chemical etching process and opened downwards only by thinning of the substrate layer. Before the thinning, metallic contact surfaces are arranged on the top side of the solar cell stack, the adjoining top side and the side surface of the hole are coated with an insulation layer, and a metal layer is then applied to the metallic contact surfaces and the insulation layer.

Titanium is typically used for good adhesion of a metal layer to a dielectric, e.g., to silicon dioxide or to silicon nitride. Because of its poor adhesion, however, Ti is used for contacting Ge and III-V semiconductors. Reliable and long-lasting adhesion to semiconductor layers made of germanium or III-V semiconductors is achieved, for example, with silver, palladium, or gold. However, precious metals such as silver, palladium, or gold show insufficient adhesion to dielectrics.

SUMMARY OF THE INVENTION

It is therefore an object of the present invention to provide a device that refines the state of the art.

According to an exemplary embodiment of the invention, a stacked multi-junction solar cell having a metallization comprising a multilayer system is provided, wherein the multi-junction solar cell has a germanium substrate forming a bottom side of the multi-junction solar cell, a germanium subcell, and at least two III-V subcells following one another in the order mentioned.

The multilayer system of the metallization has a first layer, comprising gold and germanium, with a layer thickness D1 of at least 2 nm and at most 50 nm, a second layer, comprising titanium, with a thickness D2 of at least 10 nm and at most 300 nm, a third layer, comprising palladium or nickel or platinum, with a layer thickness D3 of at least 5 nm and at most 300 nm, and at least one metallic fourth layer with a thickness D4 of at least 2 μm in the order mentioned.

The multilayer system of the metallization covers at least one first surface section and a second surface section and is integrally connected to both the first surface section and the second surface section, wherein the first surface section is formed by the dielectric insulation layer and the second surface section is formed by the germanium substrate or by a III-V layer.

It is understood that the multilayer system, as is customary for metallizations, can be annealed, i.e., heat-treated.

The temperature during the heat treatment of the multi-layer metal system can be in a range, for example, between 350°-420°.

The heat treatment can be carried out with a lamp heater, i.e., with a so-called rapid thermal annealing (RTA) process.

In particular, the temperature of the heat treatment is at least 350° C.

This achieves the eutectic temperature of the gold-germanium layer by means of which a connection between the titanium layer and the dielectric layer is first made possible.

The layers each can also be formed of or consist of the materials mentioned, wherein the term "consist" includes the fact that further substances, such as impurities, can also be included or contained.

It is understood in addition that a Ge subcell contains germanium or consists of germanium, wherein a layer consisting of germanium optionally also contains other substances, in particular dopants, but also impurities in addition to the germanium.

The same also applies to the III-V subcells, which have one or more materials from main groups III and V or consist of such materials.

Surprisingly, it has been shown that the proposed layer system adheres very reliably and for a long time to both a dielectric and a semiconductor. In particular, the thin layer thickness of the gold-germanium layer leads to a nonhomogeneous, rather to a localized permeability for the Ti layer, which enables local connections between the titanium layer and the dielectric insulation layer.

On the other hand, the thin layer thickness of the gold-germanium layer is sufficient to achieve a reliable bond between the gold-germanium layer and the Ge layer or a III-V subcell.

The multilayer system of the metallization thus opens up many possibilities for optimizing the manufacturing process and with regard to the design of the metallization, in particular with regard to through-contacts. In particular, process steps and additional or different metal structures can be eliminated.

The multi-junction solar cell of the invention therefore represents a particularly cost-effective and efficient solution.

The multi-junction solar cell can have a back-contacted front side, wherein the semiconductor wafer has at least one through-contact hole, extending from a top side of the multi-junction solar cell through the subcells to the bottom side, with a continuous side wall and a circumference that is oval in cross section, and a side wall of the through-contact hole is covered by a dielectric insulation layer.

The fourth layer can comprise silver and has a layer thickness of at least 2.5 µm and of at most 6 µm.

The multilayer system can have a fifth layer, comprising gold, with a layer thickness D5 of at least 50 nm and at most 1 µm.

The dielectric layer can comprise $SiO_2$ and/or $Si_3N_4$ or consists of $SiO_2$ and/or $Si_3N_4$.

The multi-junction solar cell can comprise a III-V cover layer, forming the front side, with a thickness of 150-500 nm and a band gap of at least 1.86 eV. The cover layer consists, for example, of InGaP or comprises InGaP.

The multilayer system of the metallization can extend from the top side of the multi-junction solar cell along the side wall through the through-contact hole to the bottom side of the multi-junction solar cell.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus, are not limitive of the present invention, and wherein.

DETAILED DESCRIPTION

Figure 1:
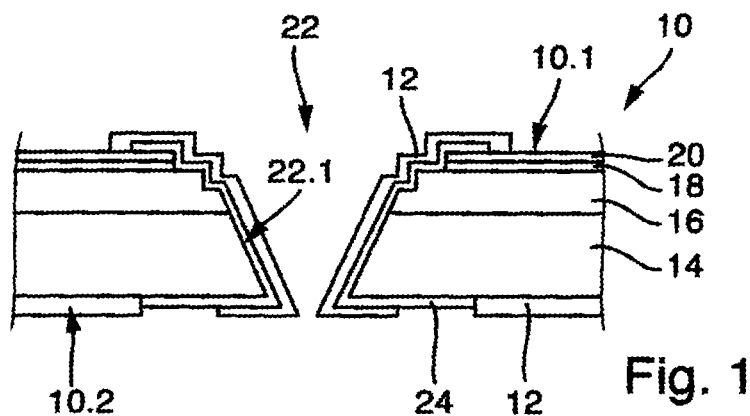
FIG. 1 shows a cross section of an exemplary embodiment of the invention of a stacked multi-junction solar cell with a back-contacted front side and a multilayer system as metallization.

The diagram in FIG. 1 shows a detail of a stacked multi-junction solar cell 10 with a metallization comprising a multilayer system 12 and a back-contacted front side in a cross section.

Multi-junction solar cell 10 has a top side 10.1 and a bottom side 10.2 as well as a through-hole 22 extending from top side 10.1 to bottom side 10.2. Multi-junction solar cell 10 comprises a germanium substrate 14 forming bottom side 10.2, a germanium subcell 16 following the germanium substrate, a first III-V subcell 18, and a second III-V subcell 20, forming top side 10.1 in the illustrated exemplary embodiment, in the order mentioned.

Through-hole 22 has a side surface 22.1, wherein side surface 22.1 is formed continuous like a circumferential surface of a cylinder and has an oval shape, e.g., circular or elliptical, in cross section.

Side surface 22.1 of through-contact hole 22 and a region of top side 10.1, said region adjoining through-hole 22, and bottom side 10.2 are covered with a dielectric insulation layer 24.

Multilayer system 12 of the metallization is formed on dielectric insulation layer 24, wherein multilayer system 12 extends from a region, adjacent to dielectric insulation layer 24, on top side 10.1 of semiconductor wafer 10, along side surface 22.1 of through-hole 22 to a region of dielectric insulation layer 24 formed on bottom side 10.2, said region adjoining the through-hole.

Multilayer system 12 therefore extends beyond dielectric insulation layer 24 on top side 10.1 of semiconductor wafer 10 and is integrally connected to both dielectric insulation layer 24 and to top side 10.1 of semiconductor wafer 10, here therefore second III-V subcell 20.

A part of bottom side 10.2, said part which is not covered by dielectric insulation layer 24, is also covered with multilayer system 12 of the metallization.

Figure 2:
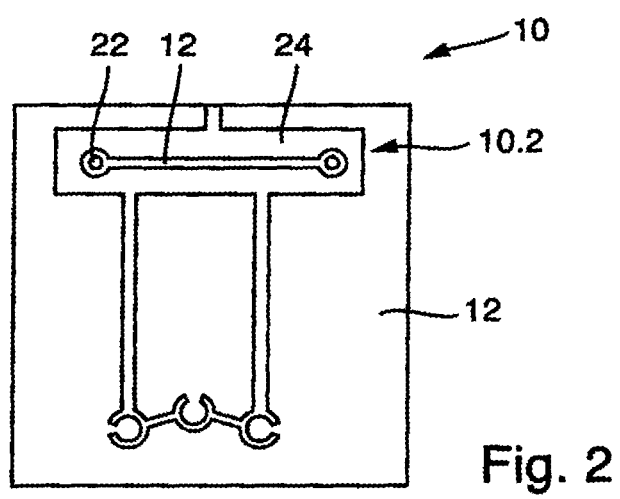
FIG. 2 is a back-side view of the multi-junction solar cell.

A back-side view of the multi-junction solar cell according to the first embodiment is shown in the diagram in FIG. 2. Only the differences from the diagram in FIG. 1 will be explained below.

Multi-junction solar cell 10 has exactly two through-holes 22. The regions of multilayer system 12 formed around through-holes 22 are connected by a web-shaped section of multilayer system 12 of the metallization and are surrounded by dielectric insulation layer 24.

A remaining surface of bottom side 10.2 of the semiconductor wafer is covered in a planar manner with multilayer system 12.

Figure 3:
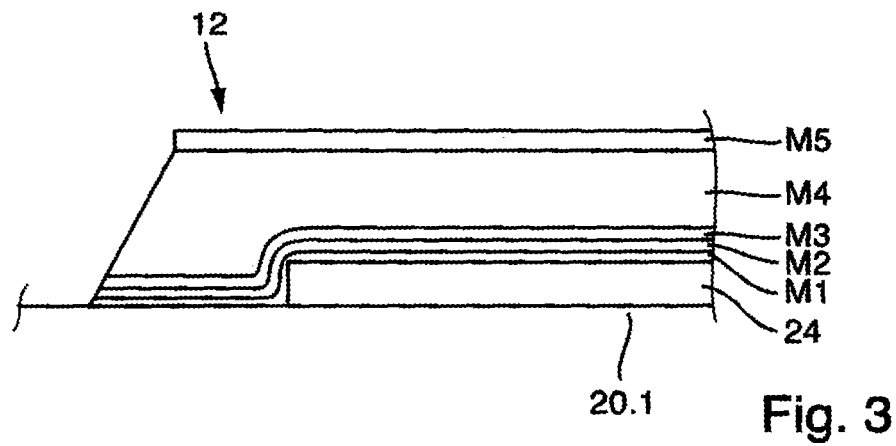
FIG. 3 shows a cross section of the multilayer system of the metallization.

The multilayer system according to a first embodiment is shown in more detail in the diagram in FIG. 3. Only the differences from the diagram in FIG. 1 will be explained below.

Multilayer system 12 comprises five layers. A first layer M1, comprising gold and germanium, with a layer thickness of at most 50 nm forms the lowermost layer, adjacent to dielectric layer 24 and semiconductor wafer 10.

The first layer M1 is followed by a second layer M2, comprising titanium, with a layer thickness of at least 10 nm. A third layer M3 comprises palladium or nickel or platinum and has a layer thickness of at least 5 nm.

A fourth metallic layer comprising silver, for example, has a layer thickness of at least 2 µm. As the uppermost layer, multilayer system 12 in the exemplary embodiment shown comprises a fifth metallic layer, e.g., comprising gold, with a layer thickness of at least 50 nm.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked multi-junction solar cell comprising:
a germanium substrate forming a bottom side of the multi-junction solar cell;
a germanium subcell;
at least two III-V subcells following one another; and
a metallization having a multilayer system including a first layer comprising gold and germanium, with a layer thickness of at least 2 nm and at most 50 nm, a second layer comprising titanium with a layer thickness of at least 10 nm and at most 300 nm, a third layer comprising palladium or nickel or platinum with a layer thickness of at least 5 nm and at most 300 nm, and at least one metallic fourth layer with a layer thickness of at least 2 µm,
wherein the multilayer system of the metallization covers at least one first surface section and a second surface section and is integrally connected to both the first surface section and the second surface section,
wherein the first surface section is formed by a dielectric insulation layer and the second surface section is formed by the germanium substrate or by a III-V layer, and the second surface section has a back-contacted front side,
wherein the germanium substrate, the germanium subcell, and the at least two III-V subcells have at least one contact through-hole extending from a top side of the multi-junction solar cell through the at least two III-V subcells to the bottom side, the at least one contact through-hole having a continuous side wall, the continuous side wall of the contact through-hole being covered by the dielectric insulation layer, and
wherein the titanium layer has local connections with the dielectric insulation layer.

2. The stacked multi-junction solar cell according to claim 1, wherein the at least one contact through-hole is oval in cross section.

3. The stacked multi-junction solar cell according to claim 1, wherein the fourth layer comprises silver and has a layer thickness of at least 2.5 µm and of at most 6 µm.

4. The stacked multi-junction solar cell according to claim 1, wherein the multilayer system has a fifth layer comprising gold, with a layer thickness of at least 50 nm and at most 1 µm.

5. The stacked multi-junction solar cell according to claim 1, wherein the dielectric insulation layer comprises $SiO_x$ and/or $SiN_x$ or consists of $SiO_x$ and/or $SiN_x$.

6. The stacked multi-junction solar cell according to claim 1, wherein the dielectric insulation layer comprises an a-Si layer.

7. The stacked multi-junction solar cell according to claim 1, wherein the multi-junction solar cell comprises a III-V cover layer forming the backcontacted front side, with a thickness of 150-500 nm and a band gap of at least 1.86 eV.

8. The stacked multi-junction solar cell according to claim 1, wherein the multilayer system of the metallization extends from the backcontacted front side of the multi-junction solar cell along the continuous side wall through the contact through-hole to the bottom side of the multi-junction solar cell.

9. The stacked multi-junction solar cell according to claim 1, wherein the local connections between the titanium layer and the dielectric insulation layer are formed by rapid thermal annealing.

10. The stacked multi-junction solar cell according to claim 1, wherein the local connections between the titanium layer and the dielectric insulation layer provide localized permeability.

11. The stacked multi-junction solar cell according to claim 1, wherein the metallization extends beyond the dielectric insulation layer on the front side, the metallization directly contacting the stacked multi-junction solar cell on the front side.

12. The stacked multi-junction solar cell according to claim 1, wherein a portion of the metallization is disposed directly on the germanium substrate on the bottom side.

* * * * *